United States Patent
Xu et al.

(10) Patent No.: US 10,955,976 B2
(45) Date of Patent: Mar. 23, 2021

(54) FLEXIBLE DISPLAY

(71) Applicant: Hewlett-Packard Development Company, L.P., Houston, TX (US)

(72) Inventors: Gang Xu, Palo Alto, CA (US); Helen A. Holder, Sunnyvale, CA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 25 days.

(21) Appl. No.: 15/567,608

(22) PCT Filed: Jul. 9, 2015

(86) PCT No.: PCT/US2015/039822
§ 371 (c)(1),
(2) Date: Oct. 18, 2017

(87) PCT Pub. No.: WO2017/007494
PCT Pub. Date: Jan. 12, 2017

(65) Prior Publication Data
US 2018/0108716 A1    Apr. 19, 2018

(51) Int. Cl.
*G06F 3/044*    (2006.01)
*G09F 9/30*    (2006.01)
(Continued)

(52) U.S. Cl.
CPC .......... *G06F 3/0443* (2019.05); *G06F 1/1652* (2013.01); *G06F 3/0412* (2013.01);
(Continued)

(58) Field of Classification Search
CPC .......... G06F 3/041; G06F 3/044; G06F 3/042; G06F 3/04815; G06F 3/04842;
(Continued)

(56) References Cited

U.S. PATENT DOCUMENTS 7,868,326 B2    1/2011 Sano et al.
8,436,819 B2    5/2013 Huang et al.
(Continued)

FOREIGN PATENT DOCUMENTS

CN    102903335 A    1/2013
CN    103620491 A    3/2014
(Continued)

OTHER PUBLICATIONS

Unknown, "3-fold Touch-sensitive 8.7 inch OLED Display from SEL"; Nov. 1, 2014; 5 pages.

*Primary Examiner* — Olga V Merkoulova
(74) *Attorney, Agent, or Firm* — Brooks Cameron & Huebsch PLLC

(57) ABSTRACT

Example implementations relate to flexible displays. For example, a flexible display system may comprise a plurality of display layers, an anti-reflective layer among the plurality of display layers to reduce reflection from an underlying light emitting layer, the anti-reflective layer including a wave plate and a polarizer, and a transistor layer among the plurality of display layers. Further, at least a portion of the plurality of display layers may include properties satisfying particular geometric and force balance constraints to enable the transistor layer to maintain a neutral force in response to compression or tension of the flexible display.

11 Claims, 3 Drawing Sheets

(51) Int. Cl.
- *H01L 51/52* (2006.01)
- *H04M 1/02* (2006.01)
- *G06F 1/16* (2006.01)
- *H01L 27/32* (2006.01)
- *G06F 3/041* (2006.01)
- *H01L 51/00* (2006.01)

(52) U.S. Cl.
CPC ............ *G09F 9/301* (2013.01); *H01L 27/323* (2013.01); *H01L 27/3244* (2013.01); *H01L 27/3262* (2013.01); *H01L 51/0097* (2013.01); *H01L 51/5253* (2013.01); *H01L 51/5281* (2013.01); *H04M 1/0268* (2013.01); *G06F 2203/04102* (2013.01); *H01L 27/326* (2013.01); *H01L 2251/5338* (2013.01); *H01L 2251/558* (2013.01)

(58) Field of Classification Search
CPC ...... G06F 1/1616; G06F 1/169; G06F 1/1692; G06F 2203/00
See application file for complete search history.

(56) References Cited

U.S. PATENT DOCUMENTS

| | | | |
|---|---|---|---|
| 8,786,570 | B1 | 7/2014 | Cho et al. |
| 8,929,085 | B2* | 1/2015 | Franklin ............... G06F 1/1626 361/749 |
| 9,287,329 | B1* | 3/2016 | Lee ..................... H01L 51/5262 |
| 10,720,485 | B2* | 7/2020 | Aoki .................... G09G 3/3233 |
| 10,796,633 | B2* | 10/2020 | Ahn .................... H01L 51/5284 |
| 2009/0167171 | A1* | 7/2009 | Jung ................... H01L 51/5237 313/504 |
| 2012/0154710 | A1* | 6/2012 | Hwang ............... G02F 1/13454 349/62 |
| 2012/0186855 | A1* | 7/2012 | Lin ......................... G06F 3/041 174/250 |
| 2012/0188173 | A1* | 7/2012 | Lin ......................... G06F 3/041 345/173 |
| 2013/0044282 | A1* | 2/2013 | Kuwabara ............. G02F 1/1333 349/96 |
| 2013/0135244 | A1* | 5/2013 | Lynch ................... G06F 3/0414 345/174 |
| 2013/0154970 | A1 | 6/2013 | Seo et al. |
| 2014/0015772 | A1 | 1/2014 | Tung et al. |
| 2014/0061651 | A1 | 3/2014 | Chang et al. |
| 2014/0071356 | A1 | 3/2014 | Petcavich |
| 2014/0145150 | A1* | 5/2014 | de Jong ............... H01L 27/3227 257/40 |
| 2014/0267099 | A1* | 9/2014 | Blair ....................... G06F 3/044 345/173 |
| 2014/0267950 | A1 | 9/2014 | Kang et al. |
| 2014/0301044 | A1* | 10/2014 | Oh ......................... G06F 1/1637 361/749 |
| 2015/0021570 | A1* | 1/2015 | Kim .................... H01L 51/5293 257/40 |
| 2015/0022732 | A1* | 1/2015 | Park ..................... G06F 3/0416 349/12 |
| 2015/0042913 | A1 | 2/2015 | You et al. |
| 2015/0060778 | A1* | 3/2015 | Kim .................... H01L 27/3258 257/40 |
| 2015/0169136 | A1* | 6/2015 | Ganti ...................... H01L 41/31 345/177 |

FOREIGN PATENT DOCUMENTS

| | | |
|---|---|---|
| TW | I373140 | 9/2012 |
| TW | 201316098 A | 4/2013 |
| TW | 201440018 A | 10/2014 |
| TW | 201518081 A | 5/2015 |

* cited by examiner

FLEXIBLE DISPLAY

BACKGROUND

A flexible display may be convenient to carry, and may embody a relatively large-sized screen, and accordingly, the flexible display may be applied to not only mobile devices, such as cellular phones, portable multimedia players (PMPs), navigation devices, ultra mobile personal computers (UMPCs), e-books, e-newspapers, and the like, but also to other fields, such as TVs, monitors, and the like.

DETAILED DESCRIPTION

Unlike rigid display devices which maintain a planar state, a flexible display may be folded in various directions and/or rolled. Accordingly, it may be desirable to construct a flexible display that can be manipulated without damaging (e.g., breaking and/or cracking) and/or impacting the performance of the flexible display. In flexible displays that include a thin film transistor (TFT) layer, the TFT layer of the flexible display may be damaged when under pressure. For instance, when the flexible display is bent and/or folded such that the TFT layer is under compression or tension, the TFT layer may break and/or crack.

In contrast, a flexible display in accordance with the present disclosure may maintain the sensitive layer, the transistor layer, in a neutral force and reduce the risk of damage to the structural integrity of the transistor layer. As used herein, to maintain the transistor layer in a neutral force refers to maintaining the transistor layer in a neutral axis, such that a net zero force (or substantially net zero force) is applied to the transistor layer.

Similarly, a flexible display in accordance with the present disclosure may incorporate and/or integrate various portions of the flexible display so as to reduce the thickness of the flexible display. For instance, a touch function may be integrated with a transistor layer to reduce the overall thickness of the flexible display. Additionally and/or alternatively, a touch function may be incorporated in a polarizing layer of the flexible display.

As used herein, to incorporate or to integrate layers within the flexible display, may refer to directly bonding the layers. For instance, the touch layer may be directly bonded to the polarizing layer. However, examples are not so limited, and to incorporate or to integrate layers may refer to physically combined layers within the flexible display. For instance, the components of the touch layer may be included in the components of the polarizing layer. Put another way, when disparate materials are referred to herein, it is to be understood that such materials may refer to separate, distinct materials that are directly bonded to one another and/or a single material with a treatment or treatments thereon to achieve particular material properties.

Figure 1:
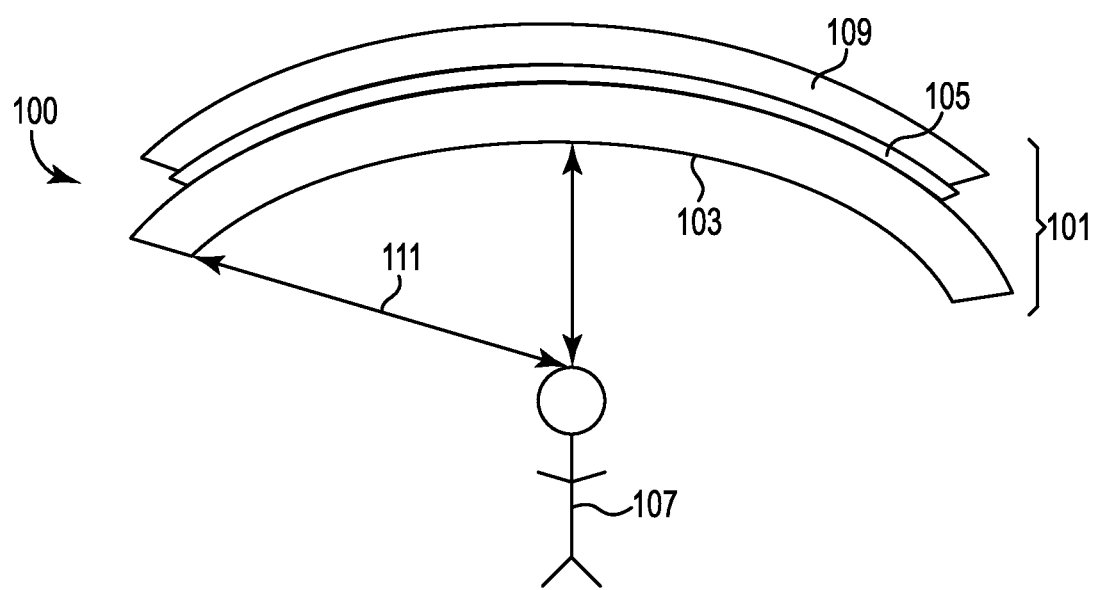
FIG. 1 illustrates an example of a flexible display system according to the present disclosure.

FIG. 1 illustrates an example flexible display system 100 in accordance with the present disclosure. The flexible display system 100 may include a flexible display 101 comprising a plurality of display layers. As used herein, a display layer refers to a layer within a flexible display 101 that includes a material and/or composition of materials for facilitating display of images. Further, as used herein, a flexible display 101 refers to a display that is capable of being folded and/or rolled in a plurality of directions. For instance, a flexible display 101 may refer to a display that is capable of dual sided bending, such that the display may be folded in a first direction and also in a second direction opposite of the first direction. Put another way, the flexible display 101 may be bent, folded, and/or manipulated as illustrated in FIG. 1, such that a viewer 107 may view the flexible display from the center of the curvature illustrated. Additionally and/or alternatively, a flexible display 101 may refer to a display that is capable of tri-fold bending, such that the flexible display 101 may be folded in at least two regions. In yet another example, a flexible display 101 may refer to a display that is capable of being rolled, such that the flexible display 101 may be bent and/or manipulated to form a substantially circular shape.

The flexible display 101 may satisfy particular geometric and force balance constraints. For instance, at least a portion of the plurality of display layers comprising the flexible display 101 may include properties satisfying the particular geometric and force balance constraints. For example, the flexible display 101 may include a top layer 103, a bottom layer 109, and a transistor layer 105. In some examples, the transistor layer 105 may include a TFT. At least a portion of the plurality of display layers (e.g., the top layer 103, the bottom layer 109, and the transistor layer 105) may include properties that satisfy the particular geometric and force balance constraints to enable the transistor layer 105 to maintain a neutral force in response to compression or tension of the flexible display 101.

The particular geometric and force balance constraints may be described in relation to the relative thickness of each layer, as well as the bending radius of the flexible display 101. Referring to FIG. 1, the flexible display 101 may be bent such that the top layer 103 is under compression, whereas the bottom layer 109 may be under tension. An assumption underlying the particular geometric and force balance constraints may be that the flexible display 101 may have a strain at yield of 3.5%. As used herein, a yield point may refer to a point at which an elastic material under increasing stress ceases to behave elastically. Also, as used herein, strain is a change in length due to a force applied. In other words, the flexible display 101 may experience a change in length of 3.5% at a particular yield point, at which point the flexible display 101 may not return to its original length. As referenced herein, the flexible display 101 may be under geometric constraints. The geometric constraints may be defined by the following equations:

$$t\_c \leq 0.035 * R \text{ and}$$

$$t\_t \leq 0.035 * R$$

where $t \leq 0.07 * R$.

As used herein, t_c refers to the thickness of the layer in the flexible display 101 that is under compression (e.g., layer 103 illustrated in FIG. 1), and t_t refers to the thickness of the layer in the flexible display 101 that is under tension (e.g., layer 109 illustrated in FIG. 1). Furthermore, R refers to the bending radius of the flexible display 101, illustrated as radius 111 in FIG. 1. Based on the above equations, when the flexible display 101 is folded, either in a tri-fold example or a dual-sided bending example as discussed previously, the radius 111 of the flexible display 101 may be 5 mm or greater. Similarly, when the flexible display 101 is folded, the total thickness of the flexible display 101, defined by the equation $t=t\_c+t_{13}\,t$, may be 0.35 mm or less (e.g., ≤0.35 mm). Also based on the above equations, when the flexible display 101 is rolled, as discussed previously, the radius 111 of the flexible display 101 may be 15 mm or greater. When the flexible display 101 is rolled, the total thickness of the flexible display 101, defined by the equation $t=t\_c+t\_t$, may be 1.05 mm or less (e.g., ≤1.05 mm).

Also referring to FIG. 1, the flexible display 101 may be under particular force balance constraints. For instance, the particular force balance constraints may be defined by the following equations:

$$(K\_t * t\_t)^2 = (K\_c)^2 \text{ and}$$

$$(K\_t * t\_t)^2 = (t\_c)^2.$$

The geometric and force balance constraints described above may enable the transistor layer 105 to maintain a neutral force in response to compression or tension of the flexible display. That is, while the top layer 103 may be under compression, and the bottom layer 109 may be under tension, the transistor layer 105 may be under neither compression nor tension.

While FIG. 1 illustrates three layers, examples are not so limited and more or fewer layers may be included in the flexible display 101 than illustrated. Furthermore, each of the layers illustrated may also include a plurality of layers. For instance, the bottom layer 109 may comprise a light emitting layer, whereas the top layer 103 may comprise an anti-reflective layer to reduce reflection from the underlying light emitting layer 109, the top layer 103 including a wave plate and a polarizer, as described further herein.

As used herein, a compressive modulus of a material refers to a ratio of the compressive stress applied to a material compared to the resulting compression. Similarly, a tensile modulus of a material refers to a ratio of stress along an axis to the strain along that axis. Put another way, the tensile modulus of a material refers to a measure of stiffness of an elastic materials. The tensile modulus may also be referred to as Young's modulus. In some examples, the top layer 103 and the bottom layer 109 may have substantially similar compressive moduli and tensile moduli. For instance, if the top layer 103 comprised an anti-reflective layer, and the bottom layer 109 comprised a light emitting layer, the anti-reflective layer and the light emitting layer may have substantially similar compressive and tensile moduli. In some examples, a thickness and Young's modulus of each of the plurality of layers satisfy the particular geometric and force balance constraints within a particular tolerance. Notably, while FIG. 1 illustrates the transistor layer 105 as being located between the top layer 103 and the bottom layer 109, examples are not so limited and the transistor layer 105 may be in a position within the flexible display 101 other than the middle. Similarly, while the phrases "top layer" and "bottom layer" were used to describe the relative positions of portions of the flexible display 101, such as an anti-reflective layer and a light emitting layer, respectively, such terminology was used merely for illustrative purposes and does not restrict the location of the anti-reflective layer and the light emitting layer. As described herein, particular layers within the flexible display 101 may be located in various positions to enable folding and/or rolling of the flexible display 101 without compromising the integrity of the transistor layer 105.

Figure 2:
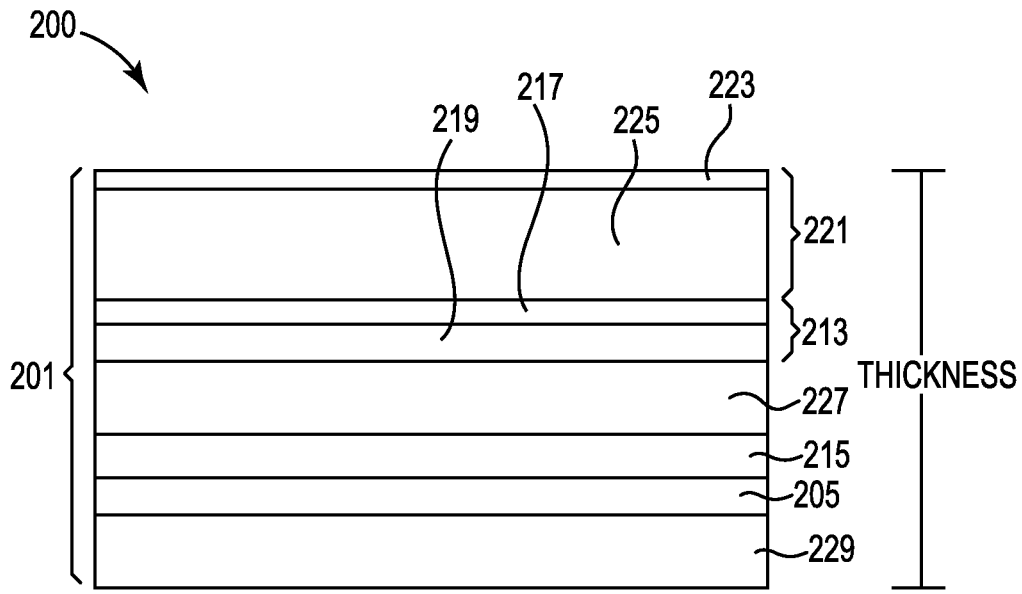
FIG. 2 further illustrates an example of a flexible display system in accordance with the present disclosure.

FIG. 2 further illustrates an example of a flexible display system 200 in accordance with the present disclosure. The flexible display system 200 may be analogous to the flexible display system 100 illustrated in FIG. 1.

As illustrated in FIG. 2, the flexible display system 200, including the flexible display 201, may comprise a plurality of display layers. For instance, the flexible display 201 may include an anti-reflective layer 213 among the plurality of display layers. The anti-reflective layer 213 may comprise a material or a plurality of materials to reduce reflection from an underlying light emitting layer 215. For instance, the flexible display 201 may include a polarizer 217 and a wave plate 219. As used herein, a polarizer may refer to an optical filter that passes light of a specific polarization and blocks waves of other polarizations. In some examples, the polarizer 217 may comprise a polyvinyl alcohol (PVA) layer. A wave plate may refer to an optical device that alters the polarization state of a light wave travelling through it. In some examples, the wave plate 219 may comprise a quarter-wave plate which converts linearly polarized light into circularly polarized light and vice versa.

Also, as illustrated in FIG. 2, the flexible display 201 may include a protective layer 221. The protective layer 221 may include a material or a plurality of materials to protect the flexible display 201 from various forces. For instance, the protective layer 221 may include a hard coating 223 as well as a cover lens 225. The hard coating 223 and/or the cover lens 225 may be comprised of a plurality of materials, such as polymethyl methacrylate (PMMA) and triacetyl cellulose (TAC), among other materials. Additionally, the flexible display 201 may include a moisture barrier layer 227. The moisture barrier layer 227 may protect the underlying light emitting layer 215 and/or underlying TFT layer 205 (e.g., a transistor layer) from damage due to moisture exposure.

FIG. 2 illustrates a moisture barrier layer 227 proximal to a transistor layer (e.g., TFT layer 205) relative to a protective layer 221. Similarly, FIG. 2 illustrates the moisture barrier layer 227 proximal to the transistor layer (e.g., TFT layer 205) relative to the anti-reflective layer 213. However, examples are not so limited. For instance, the location of the anti-reflective layer 213 and the moisture barrier layer 227 may be reversed, such that the anti-reflective layer 213 is proximal to the transistor layer (e.g., TFT layer 205) relative to the moisture barrier layer 227. The flexible display 201 may include a substrate layer 229 to form a base for the flexible display 201. The substrate layer 229 may comprise polyimide (PI), among other substrate materials. When the flexible display 201 includes a moisture barrier layer 227, as illustrated in FIG. 2, the flexible display 201 may have a thickness ranging from 0.10 mm to 0.25 mm.

Figure 3:
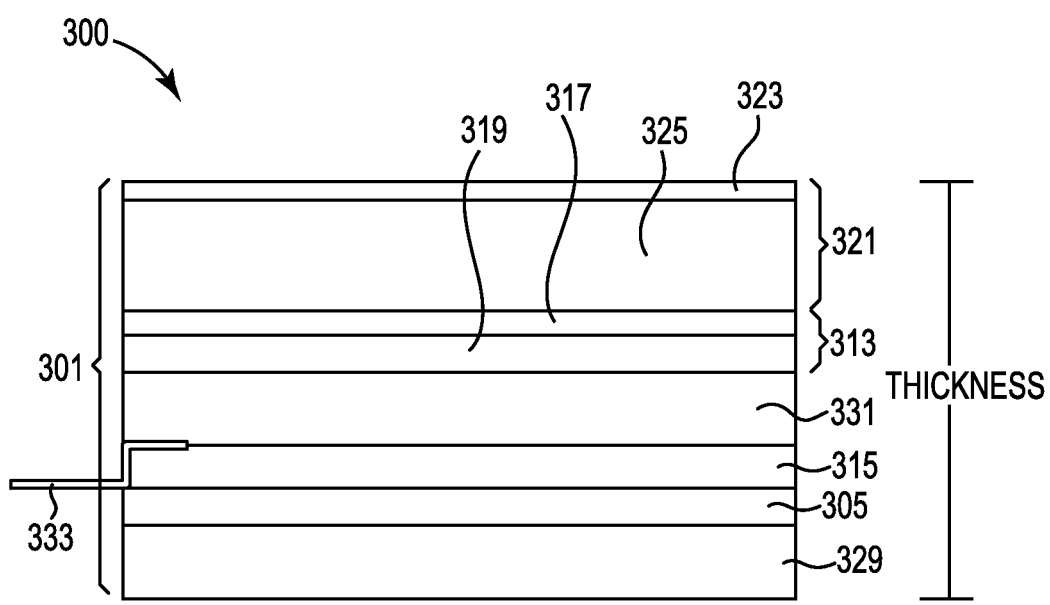
FIG. 3 further illustrates an example of a flexible display system in accordance with the present disclosure.

FIG. 3 further illustrates an example of a flexible display system 300 in accordance with the present disclosure. The flexible display system 300 may be analogous to the flexible display system 100 illustrated in FIG. 1.

As illustrated in FIG. 3, the flexible display 301 may include a capacitive touch layer 331 to form a capacitance in response to a tactile stimulation on the flexible display 301. The capacitive touch layer 331 may be comprised of a plurality of materials, such as carbon nanobuds (CNB), silver nanoparticles (Nano-Ag), copper nanoparticles (Nano-Cu), metal mesh, and/or indium tin oxide (ITO). Also, as illustrated in FIG. 3, the flexible display 301 may include the TFT layer 305 and light emitting layer 315 beneath the capacitive touch layer 331. As used herein, the light emitting layer 315 may refer to a layer including light emitting particles, such as organic light emitting diodes (OLEDs).

Figure 4:
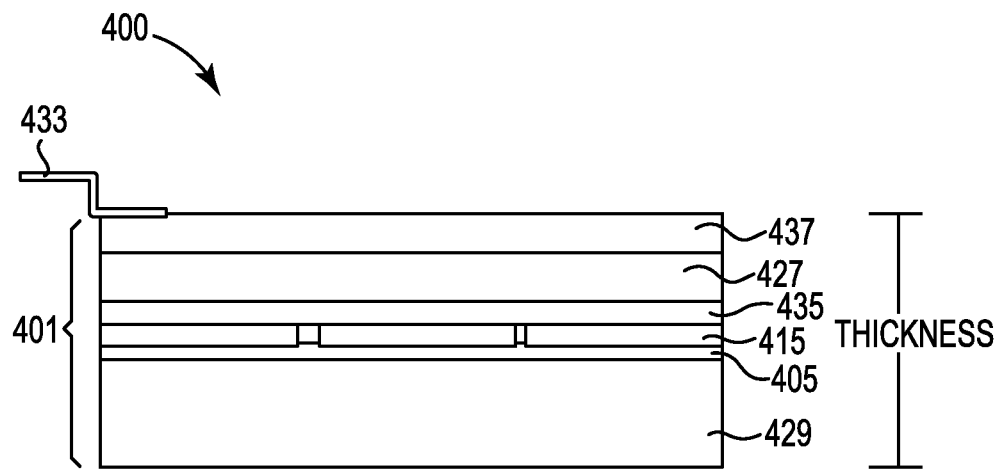
FIG. 4 further illustrates an example of a flexible display system in accordance with the present disclosure.

In some examples, the capacitive touch layer 331 may be integrated in the underlying TFT layer 305, as discussed further in relation to FIG. 4. Additionally and/or alternatively, the capacitive touch layer 331 may be integrated in the protective layer 321 and/or the anti-reflective layer 313. For instance, the capacitive touch layer 331 may be attached on the anti-reflective layer 313 by deposition and patterning, transfer, or thin film processes such that the capacitive touch layer 331 is directly bonded to the anti-reflective layer 313.

The flexible display system 300 may also include a flexible printed circuit (FPC) 333 coupled to the capacitive touch layer 331. The FPC 333 may connect the capacitive touch layer 331 to a computing system for directing the capacitive touch layer 331. Where the flexible display 301 includes a capacitive touch layer 331, as illustrated in FIG. 3, the flexible display 301 may have a thickness ranging from 0.10 mm to 0.25 mm.

FIG. 4 further illustrates an example of a flexible display system 400 in accordance with the present disclosure. The flexible display system 400 may be analogous to the flexible display system 100 illustrated in FIG. 1.

As discussed in relation to FIG. 3, a capacitive touch layer may be integrated in the transistor layer (e.g., in-cell). For instance, referring to FIG. 4, the flexible display 401 may include a transistor layer 405 which integrates a capacitive touch function. Additionally and/or alternatively, a touch function may be integrated in the flexible display system 400 using a combination of a common electrode layer and the transistor layer 405. The flexible display 401 may include a common electrode 435 disposed on the light emitting layer 415 (e.g., such as an OLED layer). In such examples, the capacitive touch layer may comprise the common electrode 435 and the transistor layer 405.

In some examples, the flexible display system 400 may include an outer touch function layer 437. As illustrated in FIG. 4, the outer touch function layer 437 may be proximal to the transistor layer 405 relative to the common electrode 435. In such examples, the capacitive touch layer may comprise the common electrode 435 and the outer touch function layer 437. Put another way, the common electrode 435 and the outer touch function layer 437 may collectively perform the functions of the capacitive touch layer 331 described in relation to FIG. 3.

In yet another example, the flexible display system 400 may include the outer touch function layer 437 without a common electrode 435, where the outer touch function layer 437 comprises materials such as CNB, Nano-Ag, Nano-Cu, metal mesh, or ITO. As illustrated in FIG. 4, the outer touch function layer 437 may be distal to the transistor layer 405. That is, the outer touch layer function layer 437 may be on a surface of the flexible display 401. That is, the outer touch function layer 437 may perform the functions of the capacitive touch layer 331 discussed in relation to FIG. 3. Also, as discussed in relation to FIG. 3, a FPC 433 may connect the outer touch function layer 437 to a computing system for directing the outer touch function layer 437. Additionally, the outer touch function layer 437 may be attached on the flexible display 401, such as on the moisture barrier layer 427, by various methods including deposition and patterning, transfer, or thin film processes, such that the outer touch function layer 437 may be directly bonded to the moisture barrier layer 427.

In examples where the touch function is integrated into the TFT layer 405, the touch function is performed by a combination of the common electrode layer and the TFT layer 405, or the common electrode layer and the outer touch function layer 437, the thickness of the flexible display 401 may be greatly reduced. For example, the thickness of such displays may range from 10 to 50 micrometers (um).

Figure 5:
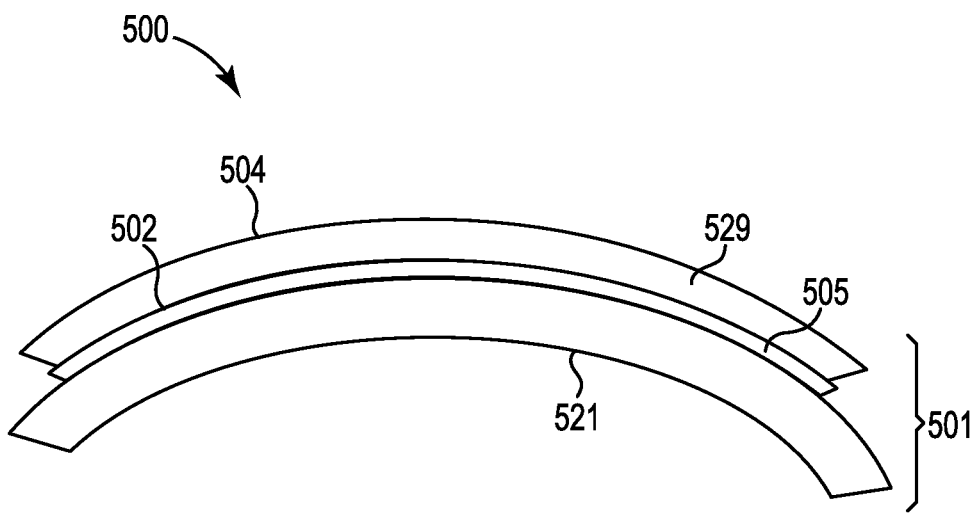
FIG. 5 further illustrates an example of a flexible display system in accordance with the present disclosure.

FIG. 5 further illustrates an example of a flexible display system 500 in accordance with the present disclosure. The flexible display system 500 may be analogous to the flexible display system 100 illustrated in FIG. 1. As discussed herein, the flexible display 501 may include a substrate layer 529 to provide mechanical support for the flexible display 501. Also, as discussed herein, the flexible display 501 may include a protective layer 521. For instance, the protective layer 521 may include a hard coating and/or a cover lens. Also, the flexible display 501 may include a transistor layer 505, such as a TFT layer. As with other examples provided herein, the flexible display 501 in accordance with the present disclosure may maintain the sensitive layer, the transistor layer 505, in a neutral force and reduce the risk of damage to the structural integrity of the transistor layer 505.

In some examples, the flexible display 501 may include a touch function that is integrated into the substrate layer 529. For instance, referring to FIG. 5, the flexible display 501 may include a protective layer 521 disposed on a first surface 502 of the substrate layer 529 and a capacitive touch layer (not illustrated in FIG. 5) on a second surface 504 of the substrate layer 529. While the protective layer 521 is described as being disposed on the first surface 502, it is noted that as described, the protective layer is not in direct contact with the first surface 502. Rather, the protective layer 521 is in direct contact with the transistor layer 505, which is in direct contact with the first surface 502. In such a manner, the touch function may be integrated on the back of the substrate layer 529, or at the front or back surfaces of the substrate layer 529. In some examples, the touch function may be integrated on the back of the substrate layer 529 using a solution such as Wacom Electro-Magnetic Resonance (EMR) solution.

In the foregoing detailed description of the present disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure.

The figures herein follow a numbering convention in which the first digit corresponds to the drawing figure number and the remaining digits identify an element or component in the drawing. Elements shown in the various figures herein can be added, exchanged, and/or eliminated so as to provide a number of additional examples of the present disclosure. In addition, the proportion and the relative scale of the elements provided in the figures are intended to illustrate the examples of the present disclosure, and should not be taken in a limiting sense. Further, as used herein, "a number of" an element and/or feature can refer to one or more of such elements and/or features.

What is claimed:
1. A system comprising:
a flexible display comprising a plurality of display layers, the plurality of display layers comprising:
a first layer, comprising:
a protective layer, the protective layer including a hard coating layer and a cover lens layer;

an anti-reflective layer to reduce reflection from an underlying light emitting layer, the anti-reflective layer including a wave plate and a polarizer, wherein the anti-reflective layer is directly bonded to a touch layer;

a capacitive touch layer to form a capacitance in response to a tactile stimulation on the flexible display; and a second layer positioned between the first layer and a substrate layer, the second layer comprising a transistor layer, wherein the first layer and the substrate layer have the same compressive moduli and tensile moduli to enable the transistor layer to maintain a neutral force in response to compression or tension of the flexible display.

2. The system of claim 1, wherein a thickness and Young's modulus of each of the plurality of layers satisfy the particular geometric and force balance constraints within a particular tolerance.

3. The system of claim 1, wherein a total thickness of the flexible display is less than 0.25 millimeters.

4. The system of claim 1, further comprising:
a moisture barrier layer among the plurality of display layers;
wherein the moisture barrier layer is nearer to the transistor layer relative to the protective layer.

5. The system of claim 4, wherein the protective layer includes at least one of polymethyl methacrylate (PMMA) and polyvinyl alcohol (PVA).

6. A system comprising:
a flexible display comprising a plurality of display layers comprising:
a first layer, comprising:
a protective layer, the protective layer including a hard coating layer and a cover lens layer;
an anti-reflective layer among the plurality of display layers directly bonded to a touch layer to reduce reflection from an underlying light emitting layer, the anti-reflective layer including a wave plate and a polarizer; and
a capacitive touch layer to form a capacitance in response to a tactile stimulation on the flexible display; and
a second layer positioned between the first layer and a substrate layer, the second layer comprising a transistor layer, wherein the first layer and the substrate layer have the same compressive moduli and tensile moduli to enable the transistor layer to maintain a neutral force in response to compression or tension of the flexible display.

7. The system of claim 6, wherein the capacitive touch layer includes a common electrode layer and the transistor layer.

8. The system of claim 7, further comprising:
an outer touch layer among the plurality of display layers, the outer touch layer proximal to the transistor layer; and
a common electrode layer;
wherein the capacitive touch layer comprises the common electrode layer and the outer touch layer.

9. The system of claim 6, further comprising:
a polarizing layer among the plurality of display layers, wherein the capacitive touch layer is incorporated in the polarizing layer.

10. A system comprising:
a flexible display comprising a plurality of display layers, the flexibly display capable of at least one of dual sided or triple fold bending, the plurality of display layers comprising:
a first layer, comprising:
a protective layer, the protective layer including a hard coating layer and a cover lens layer;
an anti-reflective layer among the plurality of display layers to reduce reflection from an underlying light emitting layer, the anti-reflective layer including a wave plate and a polarizer, wherein the anti-reflective layer is directly bonded to a touch layer; and
a capacitive touch layer to form a capacitance in response to a tactile stimulation on the flexible display; and
a second layer positioned between the first layer and a substrate layer, the second layer comprising a transistor layer, wherein the first layer and the substrate layer have the same compressive moduli and tensile moduli to enable the transistor layer to maintain a neutral force in response to compression or tension of the flexible display.

11. The system of claim 10, further comprising a moisture barrier layer among the plurality of display layers to prevent passage of fluids, wherein the moisture barrier layer is nearer to the transistor layer relative to the protective layer.

* * * * *